(12) United States Patent
Li et al.

(10) Patent No.: US 9,337,414 B2
(45) Date of Patent: May 10, 2016

(54) READER SENSOR STRUCTURE AND ITS METHOD OF CONSTRUCTION

(71) Applicant: Headway Technologies, Inc., Milpitas, CA (US)

(72) Inventors: Min Li, Fremont, CA (US); Ruhang Ding, Pleasanton, CA (US); Cherng Chyi Han, San Jose, CA (US); Jianing Zhou, Fremont, CA (US); Minghui Yu, Fremont, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 13/803,362

(22) Filed: Mar. 14, 2013

(65) Prior Publication Data
US 2014/0264665 A1     Sep. 18, 2014

(51) Int. Cl.
*G11B 5/33*       (2006.01)
*H01L 43/10*      (2006.01)
*H01L 43/00*      (2006.01)
*H01L 29/82*      (2006.01)
*G11B 5/127*      (2006.01)
(Continued)

(52) U.S. Cl.
CPC .............. *H01L 43/08* (2013.01); *G01R 33/093* (2013.01); *G01R 33/098* (2013.01); *G11B 5/3163* (2013.01); *G11B 5/398* (2013.01); *G11B 5/3909* (2013.01); *G11B 5/3983* (2013.01); *H01L 43/02* (2013.01); *H01L 43/12* (2013.01)

(58) Field of Classification Search
CPC ...... B82Y 25/00; G11C 11/16; G11C 11/161; G11C 11/15; H01F 10/3254; H01F 10/3272; H01F 10/30; H01F 10/3281; H01F 10/3204; H01F 10/3236; H01F 10/3268; H01F 10/3295; G11B 5/3909; G11B 2005/3996; G11B 5/33
USPC .................................................. 257/420–430
See application file for complete search history.

(56) References Cited

U.S. PATENT DOCUMENTS 7,178,222 B2 * 2/2007 Hasegawa .............. B82Y 10/00
216/22
7,835,116 B2 11/2010 Xue et al.
(Continued)

OTHER PUBLICATIONS

"An Areal-Density Capability Study of SMR by using improved Write and Read Heads," by T. Kagami et al., IEICE Tech. Rep, vol. 111, No. 307, MR2011-21, 1 pg., IEICE-MR MMS Conf. Nov. 18, 2011.

(Continued)

*Primary Examiner* — Nelson Garces
(74) *Attorney, Agent, or Firm* — Saile Ackerman LLC; Stephen B Ackerman

(57) ABSTRACT

A TMR (tunneling magnetoresistive) read sensor is formed in which a portion of the sensor stack containing the ferromagnetic free layer and the tunneling barrier layer is patterned to define a narrow trackwidth, but a synthetic antiferromagnetic pinning/pinned layer is left substantially unpatterned and extends in substantially as-deposited form beyond the lateral edges bounding the patterned portion. The narrow trackwidth of the patterned portion permits high resolution for densely recorded data. The larger pinning/pinned layer significantly improves magnetic stability and reduces thermal noise, while the method of formation eliminates possible ion beam etch (IBE) or reactive ion etch (RIE) damage to the edges of the pinning/pinned layer.

9 Claims, 9 Drawing Sheets

(51) Int. Cl.

| | |
|---|---|
| *H01L 29/96* | (2006.01) |
| *H01L 21/8246* | (2006.01) |
| *H01L 43/08* | (2006.01) |
| *H01L 43/12* | (2006.01) |
| *G11B 5/39* | (2006.01) |
| *H01L 43/02* | (2006.01) |
| *G11B 5/31* | (2006.01) |
| *G01R 33/09* | (2006.01) |

(56) References Cited

U.S. PATENT DOCUMENTS

| | | | |
|---|---|---|---|
| 8,184,409 B2 | 5/2012 | Xue et al. | |
| 8,223,464 B2 | 7/2012 | Yasui et al. | |
| 2005/0238924 A1* | 10/2005 | Gill | B82Y 10/00 428/837 |
| 2006/0196039 A1* | 9/2006 | Sakai et al. | 29/603.08 |
| 2007/0081279 A1* | 4/2007 | Hong | B82Y 25/00 360/324.1 |
| 2007/0206333 A1 | 9/2007 | Watanabe et al. | |
| 2008/0217710 A1* | 9/2008 | Horng et al. | 257/421 |
| 2008/0239585 A1* | 10/2008 | Ousugi et al. | 360/319 |
| 2009/0108383 A1* | 4/2009 | Horng | B82Y 10/00 257/421 |
| 2010/0178714 A1* | 7/2010 | Cho | H01L 43/12 483/3 |
| 2012/0038012 A1* | 2/2012 | Zhao | B82Y 10/00 257/421 |
| 2012/0156522 A1* | 6/2012 | Maat | B82Y 10/00 428/811.2 |
| 2012/0161263 A1* | 6/2012 | Maat et al. | 257/422 |

OTHER PUBLICATIONS

"Thermally excited magnetic noise from pinned and reference layers in current perpendicular-to-plane structure magnetoresistive heads," by Yuchen Zhou, Journal of Applied Physics 103, 07F516, 2008 American Institute of Physics, Feb. 2008, pp. 1-3.

"Analysis of thermal magnetic noise in spin-valve GMR heads by using micromagnetic simulation," by H. Akimoto et al., Journal of Applied Physics 97, 10N705, 2005 American Institute of Physics, May 2005, pp. 1-3.

"Low frequency magnetoresistive noise in spin-valve structures," by A. Ozbay et al., Applied Physics Letters 94, 202506, 2009 American Institute of Physics, May 2009, pp. 1-3.

"Feedback control of noise in spin valves by the spin-transfer torque," by Swarnali Bandopadhyay et al., Applied Physics Letters 98, 083110, 2011 American Institute of Physics, pp. 1-3.

* cited by examiner

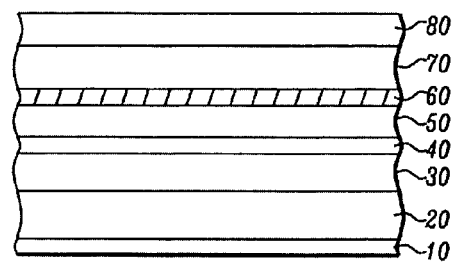
FIG. 1 – Prior Art
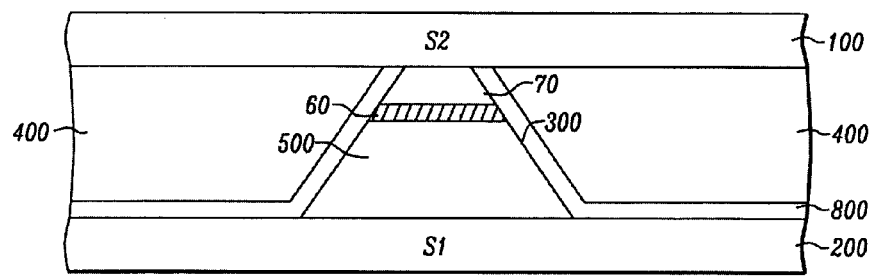
FIG. 2 – Prior Art
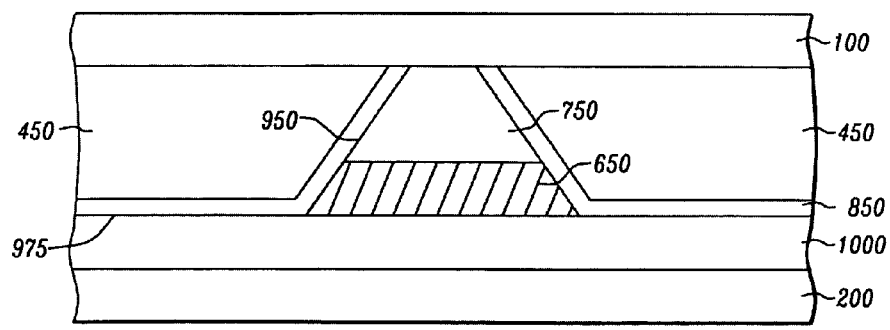
FIG. 3

READER SENSOR STRUCTURE AND ITS METHOD OF CONSTRUCTION

BACKGROUND

1. Technical Field

This disclosure relates generally to thin-film magnetoresistive read sensors and particularly to the enhancement of the magnetic stability of such sensors.

2. Description

In its simplest form, the usual giant magnetoresistive (GMR) read sensor consists of two magnetic layers, formed vertically above each other in a parallel planar configuration and separated by a conducting, but non-magnetic, spacer layer. Each magnetic layer is given a unidirectional magnetic moment within its plane and the relative orientations of the two planar magnetic moments determines the electrical resistance that is experienced by a current that passes from magnetic layer to magnetic layer through the spacer layer. The physical basis for the GMR effect is the fact that the conduction electrons are spin polarized by interaction with the magnetic moments of the magnetized layers. This polarization, in turn, affects their scattering properties within the layers and, consequently, results in changes in the resistance of the layered configuration. In effect, the configuration is a variable resistor that is controlled by the angle between the magnetizations. If the sensor is constructed and magnetized so that one of its magnetic layers, the "pinned layer" has its magnetic moment fixed in spatial direction by an adjacent "pinning layer," while the other magnetic layer, the "free layer" has a magnetic moment that is unconstrained, it is called a spin-valve sensor.

The magnetic tunneling junction device (TMR device) is an alternative form of GMR sensor in which the relative orientation of the magnetic moments in the upper and lower magnetized layers controls the flow of spin-polarized electrons tunneling through a very thin dielectric layer (the tunneling barrier layer) formed between those magnetized layers. When injected electrons pass through the upper layer, as in the GMR device, they are spin polarized by interaction with the magnetization direction (direction of its magnetic moment) of that layer. The probability of such an electron then tunneling through the intervening tunneling barrier layer into the lower magnetic layer then depends on the availability of states within the lower layer that the tunneling electron can occupy. This number, in turn, depends on the magnetization direction of the lower layer. The tunneling probability is thereby spin dependent and the magnitude of the current (tunneling probability multiplied by the number of electrons impinging on the barrier layer) depends upon the relative orientation of the magnetizations of magnetic layers above and below the barrier layer. The TMR sensor is also typically formed in a spin-valve configuration, comprising a free layer, and a pinned/pinning layer structure.

When the TMR configuration is used as a sensor or read head, (called a TMR read head, or "tunneling magnetoresistive" read head) the free layer magnetization is required to move about a central bias position by the influence of the external magnetic fields of a recorded medium, such as is produced by a moving hard disk or tape. As the free layer magnetization varies in direction, a sense current passing between the upper and lower electrodes and tunneling through the dielectric barrier layer varies in magnitude as more or less electron states become available. Thus a varying voltage appears across the electrodes (which may be the magnetic layers themselves). This voltage, in turn, is interpreted by external circuitry and converted into a representation of the information stored in the medium.

To increase the area storage density of a hard disk drive (HDD) system, trackwidth reduction in both the reader and writer sensor elements is required. With a reduction in the reader trackwidth, a reduction in its height is also required, this height being essentially the thickness of the sensor strip that forms the read element. Thus, the total volume of the read sensor must be reduced if its trackwidth is to be reduced for increased reading resolution and area storage density of the recording medium.

It is also well known that the magnetic stability of the read sensor is proportional to the device volume. Thus, as the reader sensor dimensions shrink, magnetic noise associated with the pinned and pinning layers becomes an increasing problem. This adversely impacts the reader sensor performance, as has been discussed by each of the following: A. Ozby et al., "Low frequency magnetoresistive noise in spin-valve structures," Appl. Phys. Lett., 94, 202506 (2009); A. Akimoto et al. "Analysis of thermal magnetic noise in spin-valve GMR heads by using micromagnetic simulation," J. Appl. Phys., 97, 10N705 (2005); Y. Zhou, "Thermally excited magnetic noise from pinned and reference layers in current perpendicular-to-plane structure magnetoresistive heads," J. Appl. Phys. 103, 07F516 (2008).

The prior arts show attempts at resolving performance problems stemming from the shape of sensor magnetic layers. Examples are: Xue et al., (U.S. Pat. No. 8,184,409 and U.S. Pat. No. 7,835,116); Watanabe et al. (US Pat. Appl. No. 2007/0206333) and Yasui et al. (U.S. Pat. No. 8,223,464). However, none of these attempts have addressed the problem of sensor volume reduction in the same manner and with the same effect as the method to be summarized below and then described in further detail herein.

SUMMARY

The first object of this disclosure is to form a TMR (or similar magnetoresistive) read sensor of reduced volume and improved magnetic stability.

A second object of this disclosure is to provide such a sensor having a pinned/pinning layer structure that is stable with respect to thermal agitation and resulting thermal noise.

A third object of this disclosure is to provide a sensor having an increased pinning layer volume for stability, while also providing a narrow free layer and barrier layer trackwidth for increased resolution of densely written data.

A fourth object of this disclosure is to provide a fabrication method for achieving the above objects while also reducing damage associated with etching processes such as ion-beam etch (IBE) and reactive ion etch (RIE) at the pinning layer edges.

These objects will be achieved by the design and fabrication of a TMR reader sensor structure having an enlarged-width pinning layer with the general layered structure:

AFM/AP2/Ru/Ap1

This structure will be patterned in accordance with the description in FIG. 3 below and further explained. Note that the layer normally denoted AP1, is only here intentionally denoted Ap1, as a reminder that it will be partially etched and, thereby, have a small portion that remains within the narrow trackwidth region while the bulk remains, in as-deposited form, within the enlarged-width pinning layer.

A typical bottom spin valve TMR sensor structure comprises the following sequence of layers (as yet unpatterned) shown in FIG. 1. The structure is patterned and shielded as further described in FIG. 2:

Seed/AFM/outer pinned (AP2)/Ru/inner pinned AP1)/MgO/ Free Layer/Capping Layer.

Referring to schematic FIG. 1, there is shown the above TMR layer configuration. The seed layer (10) is an underlayer required to form subsequent high quality magnetic layers, typically a layer of NiFe of between approximately 0.5 μm to 3 μm. Note that the seed layer will not be shown in the following figures, although it will be understood to be formed on a lower shield layer that serves as a substrate for the formations to be described.

The AFM (antiferromagnetic layer) (20) is required to pin the pinned layer, ie., to fix the direction of its magnetic moment by exchange coupling. It is typically a layer of IrMn of between approximately 60 A and 90 A in thickness (A=Angstroms). The pinned layer itself is now most often a synthetic antiferromagnetic (SyAF) (termed herein a synthetic antiparallel (SyAP)) structure with zero total magnetic moment.

This SyAP structure is achieved by forming an antiferromagnetically coupled tri layer whose configuration is denoted herein (see above) as "outer pinned (AP2)/Ru/inner pinned (AP1)", which is to say that two ferromagnetic layers, the outer pinned layer AP2 (30) (farthest from the free layer) and inner (closest to the free layer) pinned layer AP1 (50), are magnetically coupled across a Ru spacer layer (40) in such a way that their respective magnetic moments are mutually antiparallel and substantially cancel each other. Typically, as formed herein, the AP2 layer is a layer of CoFe of 20 A thickness, the coupling layer of Ru is formed to a thickness of approximately 4 A, and the layer AP1 is a bi-layer of CoFeB/ CoFe of approximately 25 A total thickness. The basic structure and function of such SyAP structures is well known in the art and will not be discussed in further detail herein, although the role of its patterning will be described below.

In the TMR sensor (i.e., used as a read head) there is a thin insulating (dielectric) layer (60) of (for example) oxidized magnesium (MgO) that can be oxidized in any of several different ways to produce an effective dielectric tunneling barrier layer. The MgO layer is typically approximately 9 A in thickness. The ferromagnetic free layer (70) in the TMR is usually a single ferromagnetic layer or, as used herein, a lamination of ferromagnetic material such as CoFe/CoFeB/ NiFe of total thickness approximately 60 A and the capping layer (80) is typically a layer of tantalum (Ta).

Referring now to FIG. 2, there is shown an ABS (air bearing surface) view patterned form of a schematic simplified version of the layer structure of FIG. 1, omitting some of the layers that are not germane to the following discussion. This simplified layer structure is now patterned to provide shielding and biasing (see: T. Kagami et al., "An Areal-Density Capability Study of SMR by Using Improved Write and Read Heads," FA-01 Intermag 2011, Taipei).

Referring to FIG. 2, there is shown upper shield S2 (100), lower shield S1 (200), the patterned layer structure (300) with oblique lateral side surfaces, and laterally disposed, symmetric abutting junction shields, JS (400). The junction shields are isolated from the patterned layer structure and from the bottom shield S1, by oxide material (800) that is formed around the patterned layer structure before the junction shields are formed. The junction shields can also provide hard biasing and would be formed of appropriate hard magnetic materials.

Referring to the patterned layer structure (300), there is shown as a single composition the pinning/pinned layer (500), which will be understood to be of the form: AFM/AP2/ Ru/AP1, as shown and numbered in FIG. 1, i.e. to include the AFM layer ((20) in FIG. 1) that is normally denoted the pinning layer and AP2/Ru/AP1 ((30)/(40)/(50) in FIG. 1), which is the synthetic antiferromagnetic pinned layer that is pinned by the AFM. The dimensions and material structure of this layer has been discussed above.

Above the pinning/pinned layer (500), there is the tunneling barrier layer (60) and, on top of that, there is the ferromagnetic free layer (70). In general, for a given junction structure (here, the oblique sides), reduction of the width of the free layer to reduce the trackwidth also reduces the width of the pinning/pinned layers. Note that the trackwidth of the free layer is defined by the width at the widest portion of the layer between the outward sloping sides, which is at the bottom of the free layer.

BRIEF DESCRIPTION OF THE DRAWINGS

FIG. 1 is a schematic representation of an ABS view of a typical TMR sensor stack that is unpatterned.

FIG. 2 is a schematic representation of a simplified form of the TMR stack of FIG. 1, now patterned, shielded and biased.

FIG. 3 is a schematic representation of a TMR stack designed to meet the objects of this disclosure.

DETAILED DESCRIPTION

Figure 4A:
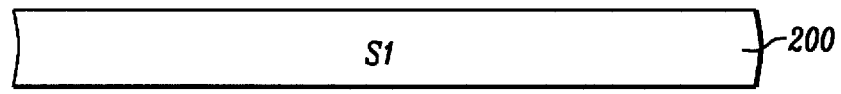
FIGS. 4a-4g schematically illustrate a first process flow (first embodiment) that will produce the structure of FIG. 3.

The present disclosure is a TMR sensor structure that is patterned to provide a reduced trackwidth together with magnetic stability at high temperatures and an absence of thermal noise from its pinning/pinned layer structure.

The improvement in performance is obtained by patterning the pinning/pinned layer structure in a manner that maintains an increased width of the pinning/pinned layer structure while etching the ferromagnetic free layer and the tunneling barrier layer to a desired narrow trackwidth.

Referring to schematic FIG. 3, there is shown, schematically, a sensor design that meets the objects of this disclosure. Upper shield S2 (100) and lower shield S1 (200) sandwich the patterned sensor structure and the laterally disposed junction shields, (450), which, unlike the structure of FIG. 2, abut only the ferromagnetic free layer (750) and the tunneling barrier layer (650). The pinning/pinned layer (1000) is not patterned to the reduced lateral width of the ferromagnetic free layer and tunneling barrier layer, but extends laterally beyond the patterned layers, eliminating the possibility of RIE or IBE trimming damage at the outer edges. An isolating oxide layer (850) separates the junction shields (450) from the laterally patterned sides (950) of the ferromagnetic free layer (750) and the tunneling barrier layer (650). Although it is not shown here, the upper surface (975) of the pinning/pinned layer (1000) may be slightly penetrated by the etch to no more than 10 angstroms.

The structure of FIG. 3, with some variations in the width of the free layer and barrier layer and the angle of their side faces, can be fabricated in any of the following four process flows (four embodiments) shown in FIGS. 4a-4g, 5a-5f, 6a-6g or 7a-7g. These methods share a common first aspect, wherein a photoresistive layer is patterned to produce a photolithographic lift-off mask, with a first width. This mask is used to define a free layer width by means of a first (essentially vertical) IBE etch, that penetrates the free layer and barrier layer completely, but penetrates only slightly into layer AP1 of the pinned layer (the uppermost layer of the pinned layer). When free layer and barrier layer material laterally disposed to the photolithographic mask is removed by the IBE, the width of the pinned layer remains unchanged relative to a reduced width of the free layer and tunnel barrier layer. This common first aspect of each of the embodiments already fulfills the major objects of the disclosure, which is to provide improved sensitivity of the sensor by reducing its trackwidth while maintaining the larger volume of the pinning/pinned layer to improve its thermal stability.

Remaining aspects of the method, as described in the remaining embodiments, are directed at a further reduction of the free layer and barrier layer widths that either retain their vertical sides or that include a shaping of their sides (a side trim) to a common, outwardly directed angle to the vertical. In either of these additional embodiments, the width of the photolithographic mask may first be reduced with a greater precision than is provided just by the photolithographic process. This additional width reduction of the mask is provided by a reactive ion etch (RIE) trimming of the mask. Subsequent to the mask trimming, a second IBE side-trim process can be applied either at the vertical angle or at a greater angle to the vertical to further reduce the width of the free layer and barrier layer and shape their sides.

First Embodiment

Referring first to schematic FIG. 4a there is shown a lower shield (200) that has been subjected to a planarization using a smoothing process such as CMP (chemical mechanical polishing).

Figure 4B:
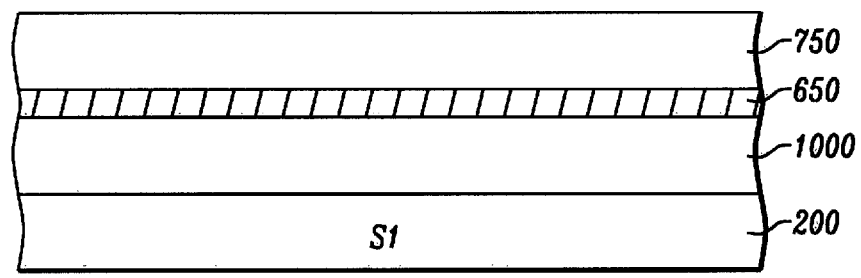

Referring next to schematic FIG. 4b, there is shown the deposition of a TMR film on the lower shield (200), including a ferromagnetic free layer (750), a tunneling barrier layer (650) and a pinning/pinned layer (1000). This layered deposition is annealed to set the desired magnetizations (details of the anneal are known in the art). The pinning/pinned layer has the previously (see FIG. 1 and its description) described form of AFM/AP2/Ru/AP1, ((20)/(30)/(40)/(50) in FIG. 1) which is not shown in detail in this figure, with the AFM (20) being deposited on S1 and the tunneling barrier layer being contiguous with AP1 (50). The relevant thicknesses of these layers have already been described above. Note that there is a seed layer understood between lower shield S1 (200) and the pinning/pinned layer fabrication (1000). This layer was shown in FIG. 1, but is not shown hereinafter.

Figure 4C:
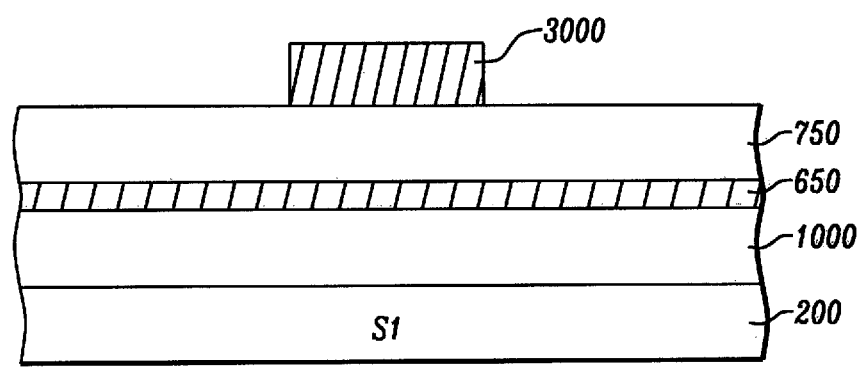

Referring next to schematic FIG. 4c, there is shown the formation of a photoresistive mask (3000) that will serve to define the trackwidth of the ferromagnetic free layer (750) and the tunneling barrier layer (650). The mask design can be a simple lift-off type and it is of a width to provide a desired trackwidth for the sensor of between approximately 30-70 nm. The trackwidth is understood to be the maximum width of the free layer subsequent to the patterning. We shall see below that a satisfactory mask width can be obtained using standard photolithographic methods that develop the portion of the mask that is to remain and dissolve the unwanted material beyond that portion. This mask width can be used to define an etch and obtain a satisfactory free layer trackwidth and it will be applied to complete the first and third embodiments. In order to create a narrower trackwidth, it becomes necessary to trim the width of the mask with greater precision using RIE technologies as described below in the second and fourth embodiments. This additional trim of the mask can reduce its width by between 3 and 15 nm.

Figure 4D:
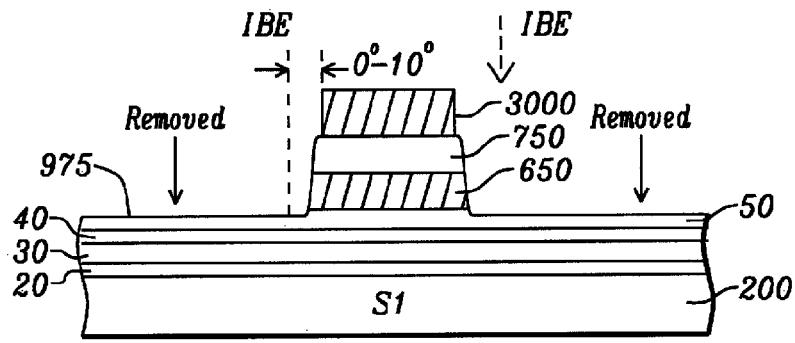

Referring next to schematic FIG. 4d, there is shown the application of an ion milling operation, which is here applied using an ion-beam etch (IBE) with beam energy of between 100 to 300 eV. The etching process, directed at an angle of between 0° and 10° outward to the vertical, removes layer material (indicated by arrow with the legend "Removed") from the free (750) and tunneling barrier (650) layers that is laterally disposed beyond the edges of the photoresistive mask and creates slightly oblique side angles of between approximately 0° and 10° with the vertical. The resulting sides of the free and barrier layer are substantially co-planar and make the same angle with the vertical. Thus, the etch passes completely through the ferromagnetic free layer (750), the tunneling barrier layer (650) and slightly penetrates layer AP1 (50) of the pinning/pinned layer to a depth of between approximately 0 to 10 angstroms. Note that the numerals (20), (30), (40) and (50) are the same as used in FIG. 1 and refer to the same coupled layers (AFM/AP2/Ru/AP1) of the pinning/pinned configuration there. They are shown again now merely to distinguish AP1 as the etch-stop layer that is possibly affected by the etch by a minimal removal of material (0-10 angstroms) from its upper surface (975).

As will be shown in the descriptions of the Second Embodiment and Fourth Embodiments below, the mask can be further reduced in width, allowing for the formation of a narrower free layer and barrier layer, by application of a reactive-ion etch (RIE) after the photolithographic patterning. This may be applied using a combination of $O_2$/Ar and/or an $O_2$ ash to actually further reduce the photoresist mask width by between approximately 3 to 15 nm, with a greater precision than is obtained using photolithographic techniques only.

After such additional width reduction, an IBE is applied guided by the width of the reduced mask. As stated above, the use of the RIE or R-IBE subsequent to photolithographic processing of the mask allows a precise and reduced width of the photoresist to be obtained, which would be difficult to obtain using only photolithography.

Figure 4E:
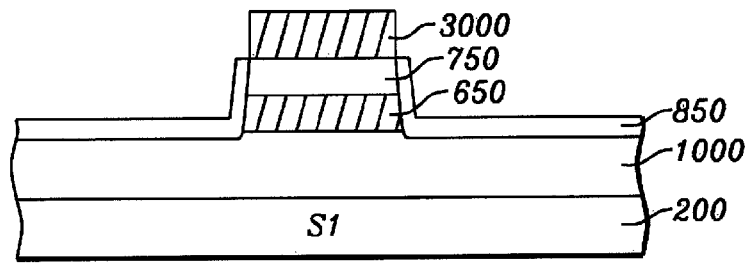

Referring next to FIG. 4e, there is shown the deposition of an isolating oxide (850), formed over exposed surfaces that resulted from the IBE etching process of FIG. 4d, with the mask width having been determined by the photolithographic process only. The oxide is advantageously an oxide such as $Al_2O_3$ or MgO and it may be formed using IBD deposition to a thickness between approximately 20 A to 50 A. Note that the entire pinning/pinned layer combination is once again labeled (1000) for clarity of the figure.

Figure 4F:
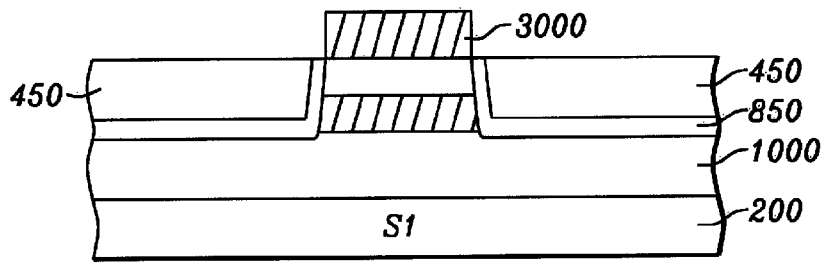

Referring next to FIG. 4f, there is shown the deposition of the junction shields (450) over the oxide layer (850) covering AP1 and also abutting the oxide-covered etched sides of the ferromagnetic free layer (750). The junction shields may function as longitudinal hard biasing layers for the ferromagnetic free layer. The shields are formed herein as layers of NiFe to a thickness between approximately 100 and 300 A.

Figure 4G:
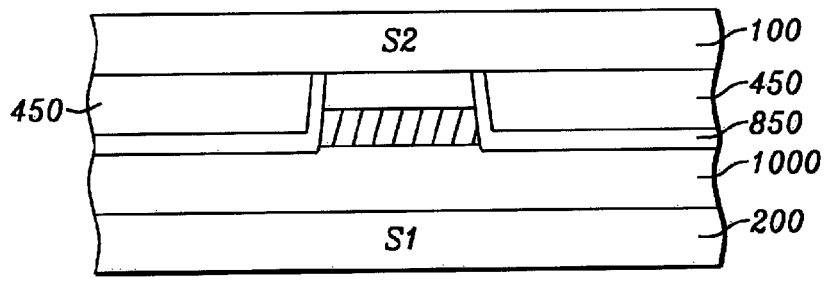

Referring finally to FIG. 4g, there is shown the fabrication of FIG. 4f with the removal (lift-off) of the photo-resistive mask ((3000) in FIG. 4f). The upper surface of the fabrication may be planarized as required and an upper shield (100) may be formed as in FIG. 3.

Second Embodiment

The second embodiment is substantially the same as the first embodiment, except that the photolithographic mask will be further trimmed to a second width by an RIE process after its original formation at a first width by a photolithographic process. In this way, a finer definition of the device trackwidth can be obtained.

Figure 5A:
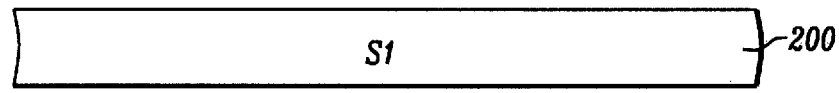
FIGS. 5a-5f schematically illustrate a second process flow (second embodiment) that will produce the structure of FIG. 3.

Referring first to schematic FIG. 5a there is shown a lower shield (200) that has been subjected to a planarization using a smoothing process such as CMP (chemical mechanical polishing).

Figure 5B:
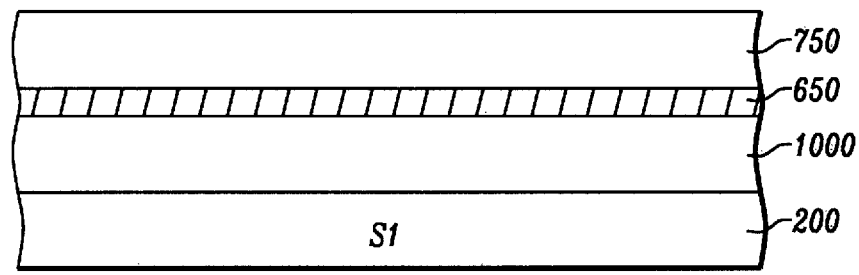

Referring next to schematic FIG. 5b, there is shown the deposition of a TMR film including a ferromagnetic free layer (750), a tunneling barrier layer (650) and a pinning/pinned layer (1000). This layered deposition is annealed to set the desired magnetizations. The pinning/pinned layer has the previously described synthetic antiferromagnetic form of AFM/AP2/Ru/AP1, ((20)/(30)/(40)/(50)) with the pinning layer AFM (20) being deposited on S1, (with an interposed seed layer being understood) and the tunneling barrier layer being contiguous with AP1 (50). The material compositions and layer thickness are as previously described.

Figure 5C:
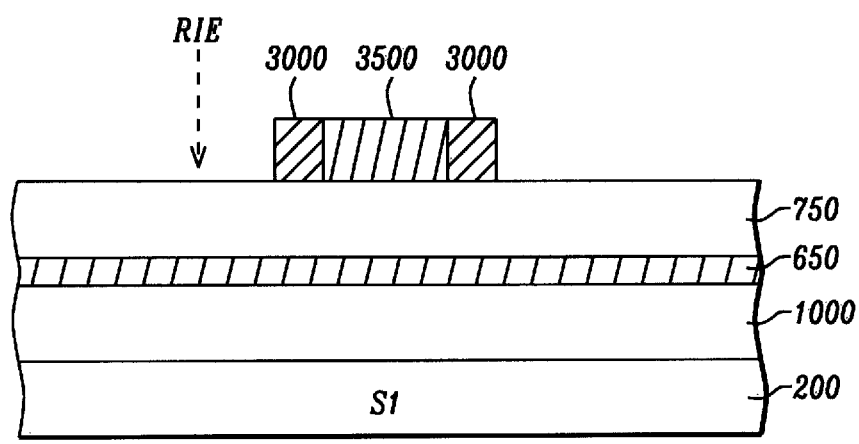

Referring next to schematic FIG. 5c, there is shown the formation of a photoresistive mask (3000) (dashed outline) having a first width that will be further reduced to a narrower second width (3500) (solid outline) to serve as a mask to define the trackwidth of the ferromagnetic free layer (750) and the tunneling barrier layer (650). The mask design can be a simple lift-off type and it is of a width produced by a first standard photolithographic processing to provide a first width. However, unlike the previous embodiment in which the mask was used with a width defined by the photolithographic process only, the mask is now further reduced in size, with more precision, using a reactive ion etch (RIE) or a reactive I-beam etch (R-IBE), such as an $O_2/Ar$ or $O_2$ reactive ion chemistry. The additional width reduction is between approximately 3-15 nm. In this way, mask (3000) of FIG. 5c is now shown reduced in width to mask (3500) by the RIE (or R-IBE) etch process which can produce a more precise width reduction. These sequential methods of reducing mask width require two different systems and two different steps. The original width of the mask is shown in dashed outline, the reduced width is shown in solid lines.

Figure 5D:
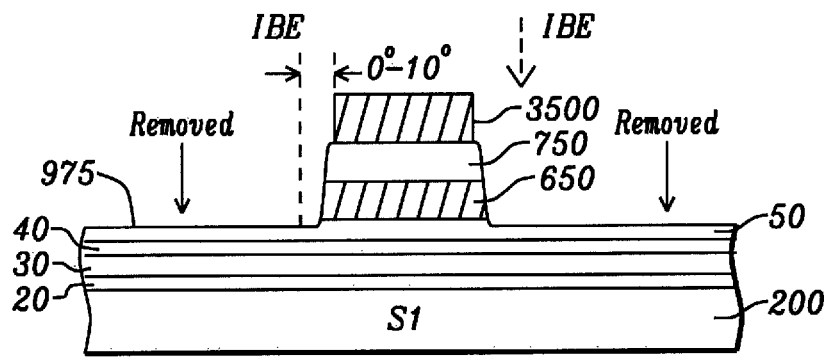

Referring next to schematic FIG. 5d, there is shown the application of an ion milling operation, such as would be applied using an ion-beam etch (IBE) with beam energy of between 100 to 300 eV and beam angle of between approximately 0° and 10° to the vertical. The etching process removes (see legend "Removed") layer material laterally disposed beyond the edges of the narrower photoresistive mask (3500) and creates oblique side angles of between approximately 0° and 10° with the vertical and etches completely through the ferromagnetic free layer (750), the tunneling barrier layer (650) and slightly penetrates layer AP1 (see upper surface (975) of layer (50)) to a depth of between approximately 0 to 10 angstroms.

Figure 5E:
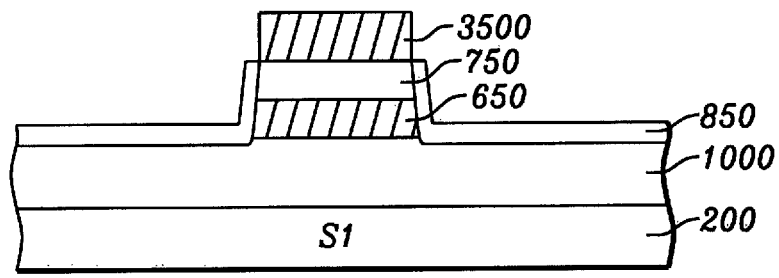

Referring next to FIG. 5e, there is shown the deposition of an isolating oxide (850), formed over exposed surfaces that resulted from the dual etching process of FIG. 5e. This process has already been described with reference to FIG. 4e.

Figure 5F:
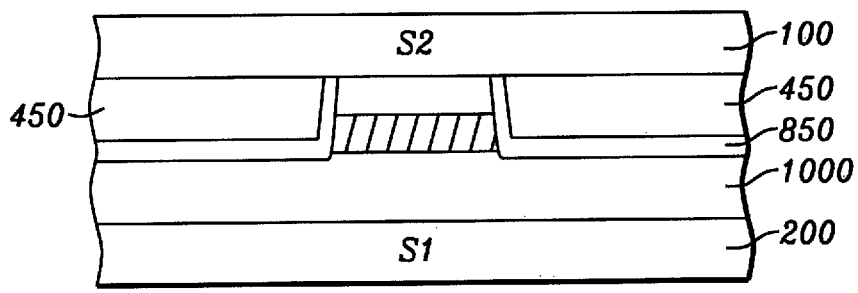

Referring next to FIG. 5f, there is shown the deposition of the junction shields (450) over the oxide layer (850) covering AP1 and against the oxide-covered etched sides of the ferromagnetic free layer (750). The junction shields may function as longitudinal hard biasing layers for the ferromagnetic free layer. This process has been described previously with reference to FIG. 4f. Finally, the structure of FIG. 5f is completed by the removal of the mask (3500), the formation of upper shield S2 (100) over the planarized upper surface of the junction shields (450) and free layer (750) and including small portions of the oxide layer (850).

Third Embodiment

The third embodiment differs from the first embodiment in that a side trim operation is applied to the perpendicular sides of the free and barrier layers subsequent to the vertical IBE that creates coplanar vertical sides. The side trim creates a junction angle (the abutting angle for the junction shields) formed by the outwardly directed oblique coplanar sides (between 45° and 75° to the horizontal) of the free and barrier layers and narrows the trackwidth to be the widest part of the free layer, where it contacts the barrier layer.

Figure 6A:
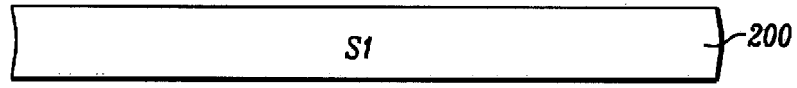
FIGS. 6a-6g schematically illustrate a third process flow (third embodiment) that will produce the structure of FIG. 3.

Referring first to schematic FIG. 6a there is shown a lower shield (200) that has been subjected to a planarization using a smoothing process such as CMP (chemical mechanical polishing).

Figure 6B:
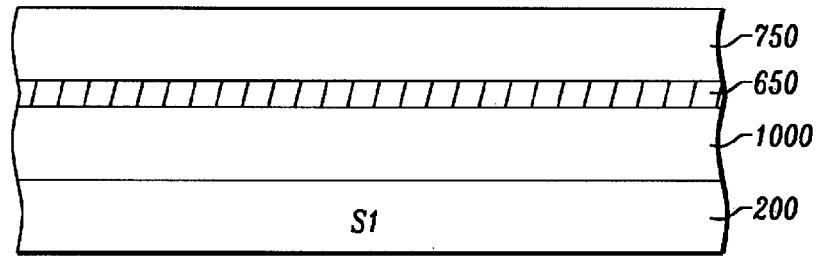

Referring next to schematic FIG. 6b, there is shown the deposition of a TMR film including a ferromagnetic free layer (750), a tunneling barrier layer (650) and a pinning/pinned layer (1000). This layered deposition is annealed to set the desired magnetizations. The pinning/pinned layer has the previously described (FIG. 1) form of AFM/AP2/Ru/AP1, ((20)/(30)/(40)/(50)) with the AFM (20) being deposited on a seed layer on S1 and the tunneling barrier layer being contiguous with AP1 (50).

Figure 6C:
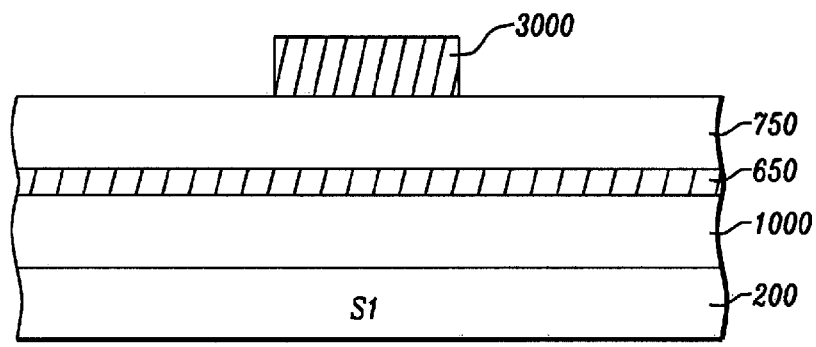

Referring next to schematic FIG. 6c, there is shown the deposition and patterning of a photoresistive mask (3000) that will serve as a mask to define the trackwidth of the ferromagnetic free layer (750) and the tunneling barrier layer (650). The patterning step, shown here in FIG. 6c, is a single operation done using standard techniques of photolithography, which can produce an acceptable mask width.

Figure 6D:
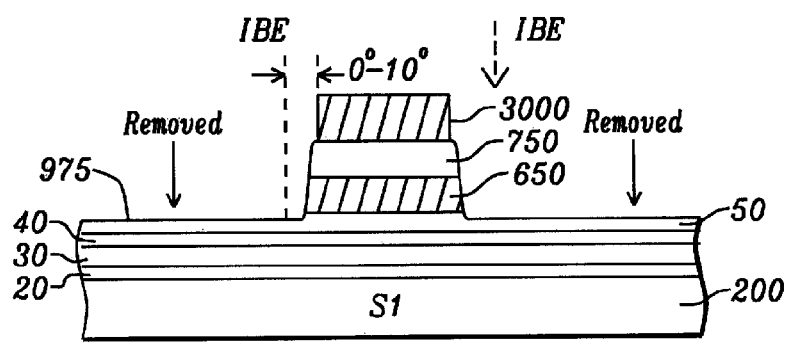

Referring to schematic FIG. 6d, there is shown a first IBE etch using the mask (3000) with the mask width established by this photolithographic method. This first etching (arrows, IBE) of the free layer can be done to establish an initial free layer track width. Note that this IBE, with an angle to the vertical between 0° and 10° leaves the sides of the free layer (750) and the barrier layer (650) nearly vertical and with a common angle to the vertical. The etching process removes (see legend "Removed") layer material laterally disposed beyond the edges of the photoresistive mask (3000) and creates oblique side angles of between approximately 0° and 10° with the vertical and etches completely through the ferromagnetic free layer (750), the tunneling barrier layer (650) and slightly penetrates layer AP1 (see upper surface (975) of layer (50)) to a depth of between approximately 0 to 10 angstroms.

Figure 6E:
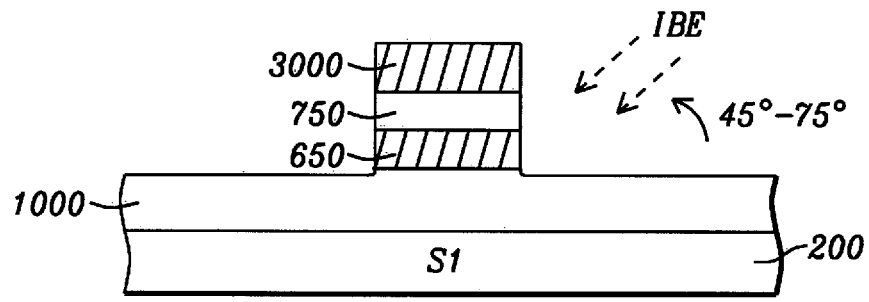

Referring now to schematic FIG. 6e, there is shown a second IBE to be applied to the fabrication of FIG. 6d. This second IBE is applied at an angle to the horizontal (45° to) 75° to shape the sides of the free layer (755) and the barrier layer (650) to create a junction for the junction shields that has a truncated triangular shape with coplanar lateral sides. The side trimming operation on the layered device reduces its trackwidth still further and achieves a smooth and continuous slope. The trackwidth is now effectively the maximum width of the free layer, which is attained where the free layer contacts the barrier layer. Note that the free layer trackwidth is now between approximately 30 and 70 nm. The second IBE ion milling operation, to create the more oblique junction angle, is applied using an ion-beam etch (IBE) with beam energy of between 100 to 300 eV at an angle to the horizontal between approximately 45° and 75°.

Figure 6F:
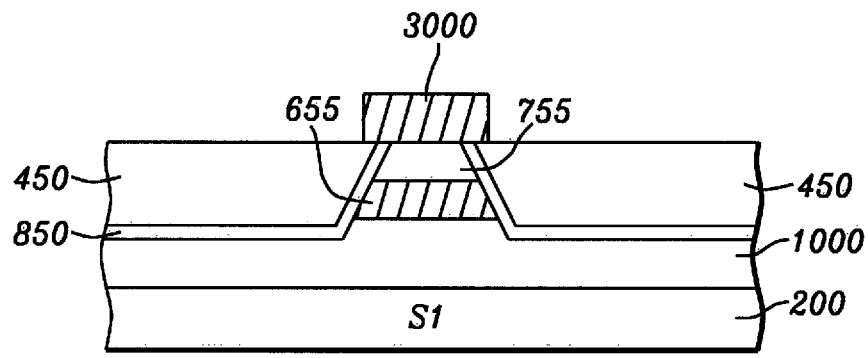

Referring next to schematic FIG. 6f, there is shown the deposition of an isolating oxide (850), formed over exposed surfaces that resulted from the dual etching process of FIG. 6d together with the deposition of the junction shields (450) over the oxide layer (850) covering AP1 and abutting against the oxide-covered etched sides of the ferromagnetic free layer (750). The junction shields may function as longitudinal hard biasing layers for the ferromagnetic free layer.

Figure 6G:
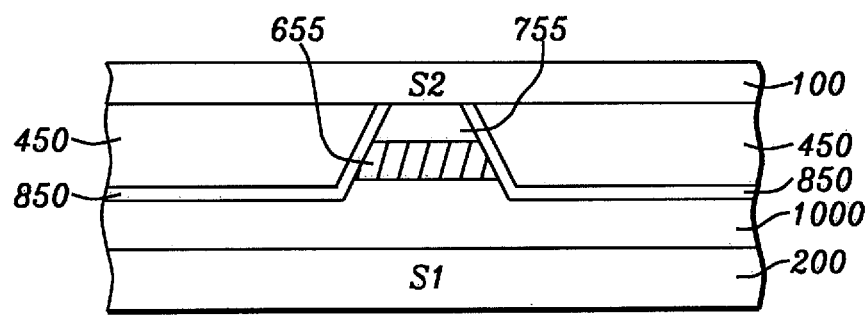

Referring finally to schematic FIG. 6g, there is shown the fabrication of FIG. 6f with the removal of the photo-resistive mask. The upper surface of the fabrication may be planarized as required and an upper shield (100) may be formed as previously.

Fourth Embodiment

This embodiment differs from the previous embodiment only in the fact that the photolithographic mask is thinned to a second width using an RIE process subsequent to its original first width that resulted from a photolithographic process. The additional thinning allows the trackwidth to be formed with a more precise dimension that is provided only by the photolithographic patterning.

Figure 7A:
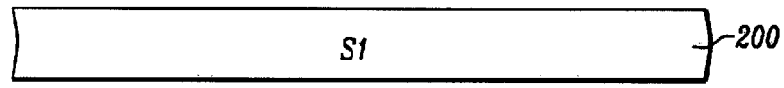
FIGS. 7a-7g schematically illustrate a fourth process flow (fourth embodiment) that will produce the structure of FIG. 3.

Referring first to schematic FIG. 7a there is shown a lower shield (200) that has been subjected to a planarization using a smoothing process such as CMP (chemical mechanical polishing).

Figure 7B:
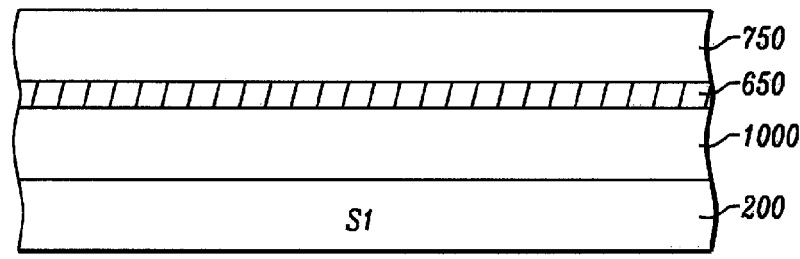

Referring next to schematic FIG. 7b, there is shown the deposition of a TMR film including a ferromagnetic free layer (750), a tunneling barrier layer (650) and a pinning/pinned layer (1000). This layered deposition is annealed to set the desired magnetizations. The pinning/pinned layer has the previously described (FIG. 1) form of AFM/AP2/Ru/AP1, ((20)/(30)/(40)/(50)) with the AFM (20) being deposited directly on S1 and the tunneling barrier layer being contiguous with AP1 (50).

Figure 7C:
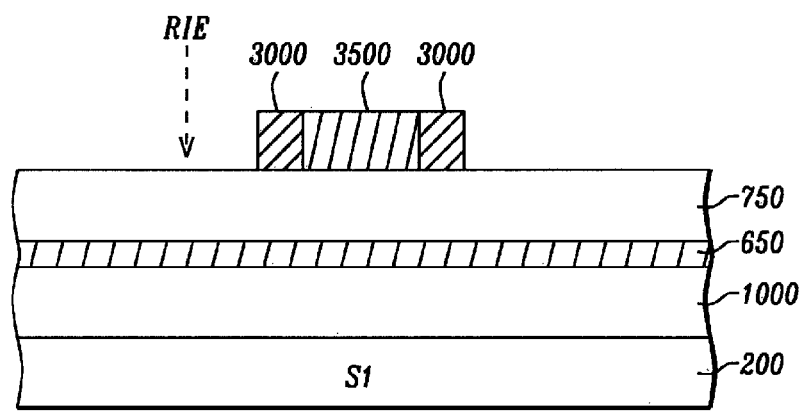

Referring next to schematic FIG. 7c, there is shown the formation of a photoresistive mask (3000) (dashed outline) having a first width that will be further reduced to a narrower second width (3500) (solid outline) to serve as a mask to define the trackwidth of the ferromagnetic free layer (750) and the tunneling barrier layer (650). The mask design can be a simple lift-off type and it is of a width produced by a first standard photolithographic processing to provide a first width. However, unlike the previous embodiment in which the mask was used with a width defined by the photolithographic process only, the mask is now further reduced in size, with more precision, using a reactive ion etch (RIE) or a reactive I-beam etch (R-IBE), such as an $O_2/Ar$ or $O_2$ reactive ion chemistry. This second RIE process thins the width of the mask by an additional 3-15 nm. In this way, mask (3000) of FIG. 5c is now shown reduced in width to mask (3500) by the RIE (or R-IBE) etch process which can produce a more precise width reduction. These sequential methods of reducing mask width require two different systems and two different steps. The original width of the mask is shown in dashed outline, the reduced width is shown in solid lines.

Figure 7D:
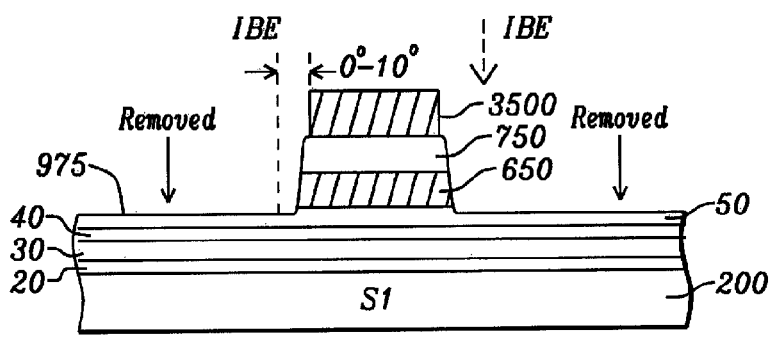

Referring to schematic FIG. 7d, there is shown a first IBE etch using the reduced-width mask (3500). This first etching (arrows, IBE) of the free layer can be done to establish an initial free layer track width. Note that this IBE, with an angle to the vertical between 0° and 10° leaves the sides of the free layer (750) and the barrier layer (650) nearly vertical and with a common angle to the vertical. The etching process removes (see legend "Removed") layer material laterally disposed beyond the edges of the photoresistive mask (350) and creates oblique side angles of between approximately 0° and 10° with the vertical and etches completely through the ferromagnetic free layer (750), the tunneling barrier layer (650) and slightly penetrates layer AP1 (see upper surface (975) of layer (50)) to a depth of between approximately 0 to 10 angstroms.

Figure 7E:
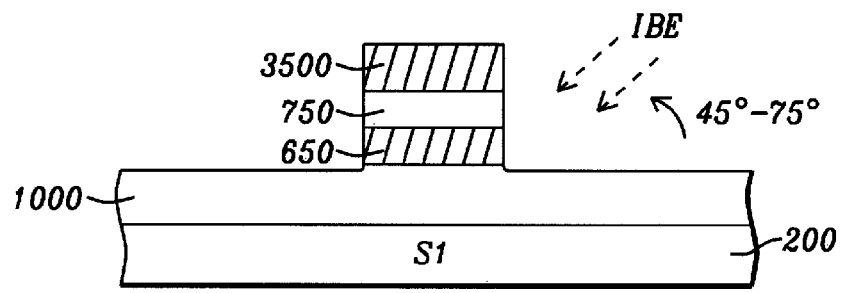

Referring now to schematic FIG. 7e, there is shown a second IBE applied at a angle to the horizontal (45° to 75°) to shape the sides of the free layer (755) and barrier layer (650) for the abutting junction with the junction shields (450) and reduce the trackwidth still further and as well to achieve a smooth and continuous slope. This second IBE is applied using an ion-beam etch (IBE) with beam energy of between 100 to 300 eV at an angle to the vertical between approximately 45° and 75°.

Figure 7F:
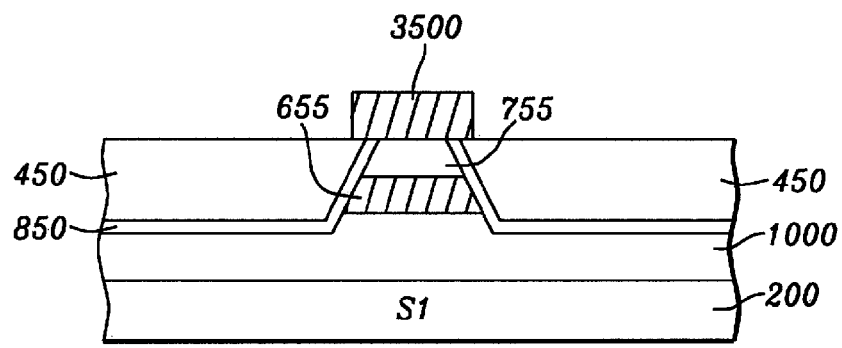

Referring next to schematic FIG. 7f, there is shown the deposition of an isolating oxide (850), formed over exposed surfaces that resulted from the dual etching process of FIG. 6d together with the deposition of the junction shields (450) over the oxide layer (850) covering AP1 and abutting against the oxide-covered etched sides of the ferromagnetic free layer (750). The junction shields may function as longitudinal hard biasing layers for the ferromagnetic free layer.

Figure 7G:
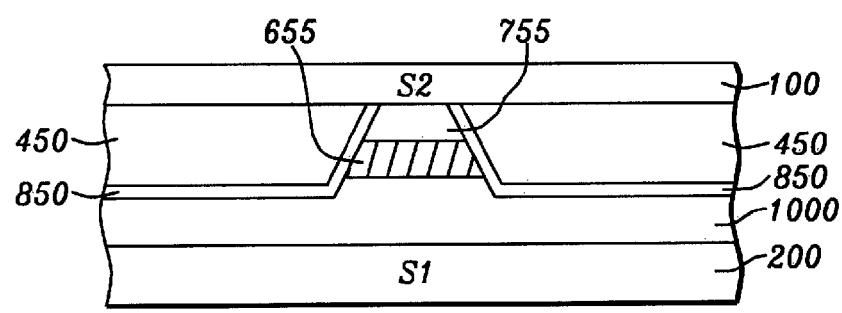

Referring finally to schematic FIG. 7g, there is shown the fabrication of FIG. 7f with the removal of the photo-resistive mask. The upper surface of the fabrication may be planarized as required and an upper shield (100) may be formed as previously.

As is understood by a person skilled in the art, the present description is illustrative of the present disclosure rather than limiting of the present disclosure. Revisions and modifications may be made to methods, materials, structures and dimensions employed in forming and providing a TMR read sensor of reduced trackwidth and enhanced magnetic stability, while still forming and providing such a structure and its method of formation in accord with the spirit and scope of the present disclosure as defined by the appended claims.

What is claimed is:

1. A TMR read sensor comprising:
    a horizontal lower shield;
    a horizontal upper shield;
    a horizontally layered TMR sensor stack formed between said lower shield and said upper shield, wherein said TMR sensor stack has a patterned portion containing an upper layer that is a free layer having a trackwidth defined by said pattern; and
    symmetrically opposed, horizontal junction shields abutting said patterned portion and extending upward no further than an upper surface of said free layer with which they form a coplanar surface; and wherein said TMR sensor stack comprises:
        a pinning layer formed contiguous with said lower shield;
        a pinned layer formed on said pinning layer;
        a tunneling barrier layer formed on said pinned layer;
        a ferromagnetic free layer formed on said tunneling barrier layer; and wherein
    said patterned portion is defined by symmetrically opposed lateral sides, wherein said sides laterally bound said ferromagnetic free layer and laterally bound said tunneling barrier layer and wherein a maximum width of said free layer defines a trackwidth;
    wherein said sides laterally bounding said ferromagnetic free layer and said sides laterally bounding said tunneling barrier layer are coplanar and make an angle $\theta_1$ to a vertical direction and wherein said coplanar sides penetrate, by a minimal penetration amount into an upper surface of said pinned layer;
    wherein portions of said pinned layer laterally disposed to either side of said patterned portion are uniformly reduced in thickness to produce an upper surface that is horizontal, smooth and planar by the removal of all portions of said pinned layer above said penetration amount;

wherein said pinned layer and said pinning layer extend laterally and symmetrically, with a constant thickness, beyond said lateral coplanar sides of said patterned portion; and wherein said extended pinned and pinning layers provide a magnetic stability to said narrowly patterned free layer; wherein a layer of isolating oxide conformally covers said horizontal, smooth and planar upper surface of said pinned layer and said coplanar lateral sides of said patterned portion, forming a junction thereat; and wherein said symmetrically disposed pair of junction shields are conformally and contiguously positioned between said upper shield and said layer of isolating oxide and abut said junction forming a coplanar surface with said upper surface of said free layer.

2. The TMR read sensor of claim 1, wherein said pinning layer is a layer of antiferromagnetic material (AFM) that contacts said lower shield and wherein said pinned layer is of the form AP2/Ru/AP1, wherein AP2 contacts said pinning layer and wherein AP1 contacts said tunneling barrier layer and wherein AP2 and AP1 are ferromagnetic layers whose magnetic moments are in an antiparallel configuration and are magnetically coupled in said antiparallel configuration across an interposed layer of Ru to form a synthetic antiferromagnetic structure.

3. The TMR sensor of claim 2 wherein an upper surface of said layer AP1 is penetrated by a penetration amount by said patterning and wherein said AP1 layer has a portion of as-deposited thickness that serves as a base for said patterned free layer and tunneling barrier layer configuration, and wherein said AP1 layer has a remaining portion, of thickness that is diminished by said penetration amount, which is an amount of no more than 10 Å relative to said as-deposited thickness, wherein said remaining portion extends laterally and symmetrically beyond the maximum width of said patterned tunneling barrier layer.

4. The TMR sensor of claim 2 wherein said AP2 layer is a layer of CoFe of approximately 20 Å thickness, wherein said layer of Ru is formed to a thickness of approximately 4 Å, and wherein said layer AP1 is a bi-layer of CoFeB/CoFe of approximately 25 Å total thickness.

5. The TMR sensor of claim 1 wherein said angle $\theta_1$ of said lateral sides is directed laterally outward to between 0° and 10° to a vertical direction.

6. The TMR sensor of claim 1 wherein said angle $\theta_1$ makes an outwardly directed angle between 45° and 75° with a horizontal direction and wherein said patterned portion has a cross-sectional shape that forms a truncated triangle.

7. The TMR sensor of claim 1 wherein said layer of isolating oxide is the oxide $Al_2O_3$ or MgO formed to a thickness between approximately 20 and 50 Å.

8. The TMR sensor of claim 1 wherein said junction shields are layers of NiFe formed to a thickness between approximately 100 and 300 Å.

9. The TMR sensor of claim 1 wherein said trackwidth is between approximately 30 and 70 nm.

\* \* \* \* \*